United States Patent [19]

Blanchard et al.

[11] 3,893,742

[45] July 8, 1975

[54] CARRIER FOR MICROCIRCUIT PACKAGES

[75] Inventors: Kenneth E. Blanchard, South Bend, Ind.; Kenneth R. Hook, West Trenton, N.J.; Arthur R. Midili, South Bend, Ind.

[73] Assignee: Wells Electronics, Inc., South Bend, Ind.

[22] Filed: Nov. 29, 1973

[21] Appl. No.: 420,209

[52] U.S. Cl. .......... 339/119 R; 339/176 MP

[51] Int. Cl. .......... H01r 13/60

[58] Field of Search .......... 339/119, 176 MP, 91 R, 339/17 CF

[56] References Cited

UNITED STATES PATENTS

| | | | |
|---|---|---|---|
| 3,066,367 | 12/1962 | Garman | 339/119 R |
| 3,241,094 | 3/1966 | Harton | 339/91 R X |
| 3,506,947 | 4/1970 | Leskosek | 339/119 R |
| 3,705,377 | 12/1972 | Hansen et al. | 339/119 R X |
| 3,784,960 | 1/1974 | Bruckner | 339/176 MP X |

*Primary Examiner*—Roy Lake
*Assistant Examiner*—E. F. Desmond
*Attorney, Agent, or Firm*—Oltsch & Knoblock

[57] ABSTRACT

A carrier for microcircuit packages in which the packages are releasably interlocked within the carrier by a snap-fitting arrangement.

5 Claims, 6 Drawing Figures

CARRIER FOR MICROCIRCUIT PACKAGES

BACKGROUND OF THE INVENTION

The invention hereinafter described relates to a carrier for a dual-in-line integrated circuit package utilized in the electronics industry.

Heretofore, carriers such as that disclosed in U.S. Pat. No. 3,480,902, have been designed to accommodate dual-in-line integrated circuit packages having outwardly bent leads which are connected along the sides of the package body and which when inserted into the carrier are wedged against the inside walls of the carrier to cause the package to be retained by the carrier. With the advent of dual-in-line integrated circuit packages having side brazed leads, that is leads which parallel the sides of the package and which are not bent outwardly, the need for the development of a new type carrier was presented. In the following paragraph, a carrier is described which will accommodate integrated circuit packages having side brazed or similar straight leads.

SUMMARY OF THE INVENTION

The carrier of this invention is of a box-like structure having two side walls and two adjoining end walls. The structure is open at its upper and lower edges with the side walls thereof having opposed inner faces defining shoulder means. Each side wall inner face also carries a protrusion means spaced from the shoulder means. The integrated circuit package fits within the carrier, being supported upon the shoulder means and having the protrusion means therein overlapping the body part of the package to retain the package within the carrier.

Accordingly, it is an object of this invention to provide a carrier for a dual-in-line integrated circuit package in which the package is retained within the carrier by a snap-fitting arrangement.

Another object of this invention is to provide a carrier of economical construction for a dual-in-line integrated circuit package.

Still another object of this invention is to provide a carrier which is for an integrated circuit package and which is of reliable operation.

BRIEF DESCRIPTION OF THE DRAWINGS

A preferred embodiment of this invention has been chosen for purposes of illustration and description wherein.

DESCRIPTION OF THE PREFERRED EMBODIMENT

The preferred embodiment illustrated is not intended to be exhaustive or to limit the invention to the precise form disclosed. It is chosen and described in order to best explain the principles of the invention and its application and practical use to thereby enable others skilled in the art to best utilize the invention.

Figure 6:
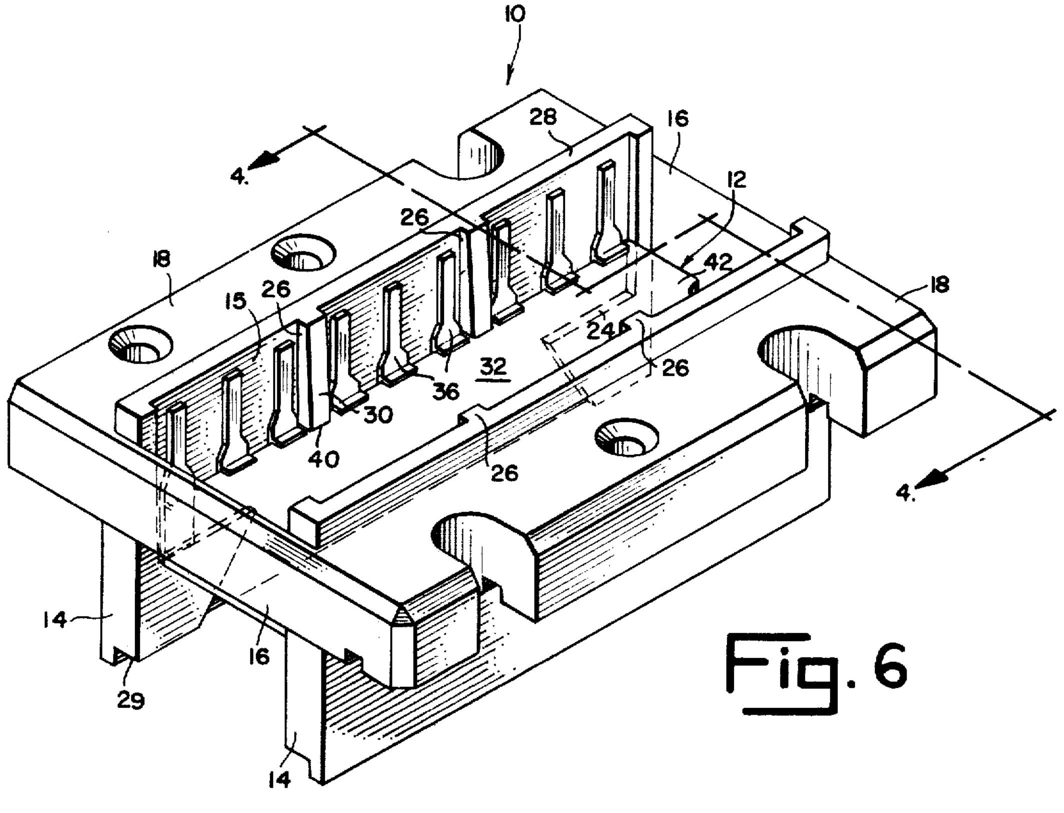
FIG. 6 is a perspective view of the carrier with the circuit package fitted therein.

Carrier 10 is utilized to receive a dual-in-line integrated circuit package, such as the package 12 shown in FIG. 6, for the purpose of allowing the package to be handled and manipulated during testing, package, and circuit board application procedures. Carrier 10 is preferably formed from a plastic composition, such as polysulfone, by molding and is of a box-like configuration, having two side walls 14 and two end walls 16 which cooperate to define a vertical opening through the carrier. A flange 18 extends along each side wall 14. Flanges 18 have a plurality of polarization notches 20 and openings 22 formed therein. Notches 20 and openings 22 serve to orient the carrier and its package and are utilized to accommodate locating pins and similar members constituting parts of selected handling apparatus. The number and location of notches 20 and openings 22 will vary from carrier to carrier, depending upon the type of testing and handling apparatus with which the carrier is to be used.

Each side wall 14 of carrier 10 is formed with a pair of shoulders 24 which project outwardly from inner face 15 of the side wall. Each side wall 14 also has one or more protruding ribs 26 formed thereon which project outwardly from its face 15. Ribs 26 extend vertically from open edge 28 toward the opposite open edge 29 of the carrier and terminate in end edges 40 which are spaced above the level of shoulder 24. The inner faces 30 of ribs 26 are preferably tapered toward edge 28 for a purpose later to be described.

Figure 1:
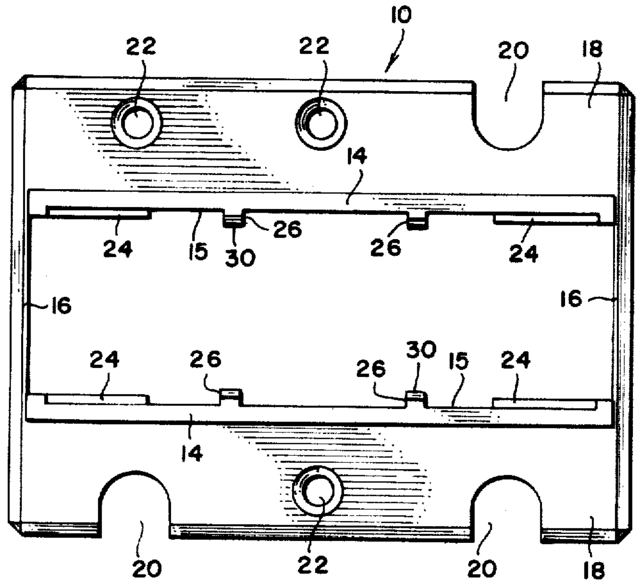
FIG. 1 is a plan view of the carrier.
Figure 2:
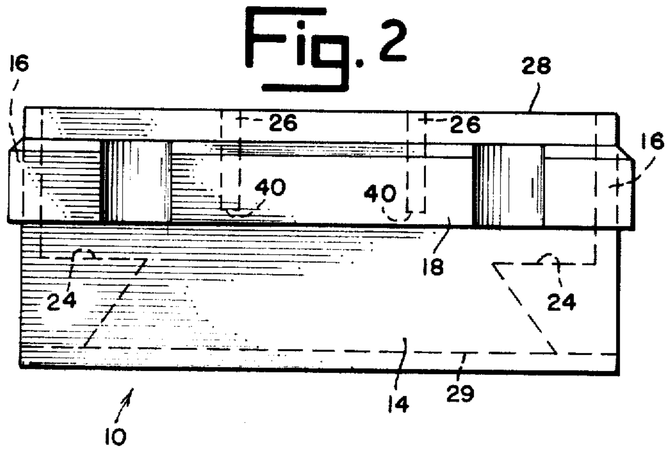
FIG. 2 is a side view of the carrier.
Figure 3:
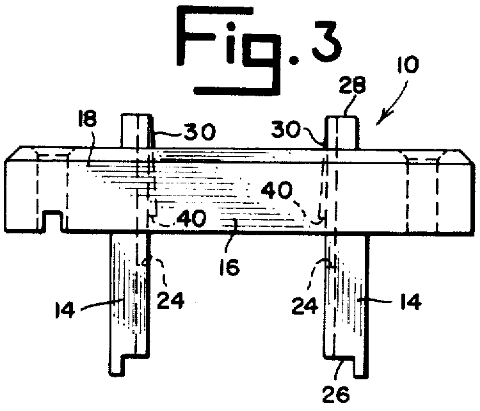
FIG. 3 is an end view of the carrier.
Figure 4:
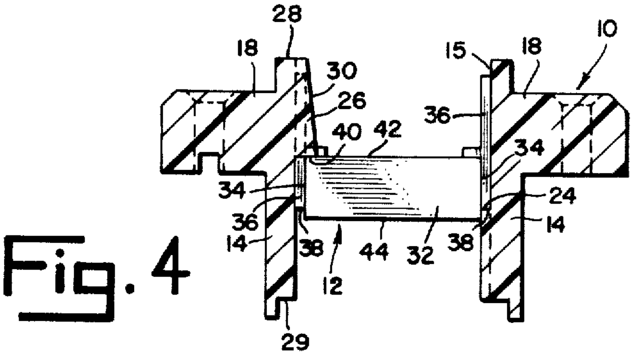
FIG. 4 is a sectional view taken along line 4—4 of FIG. 6.
Figure 5:
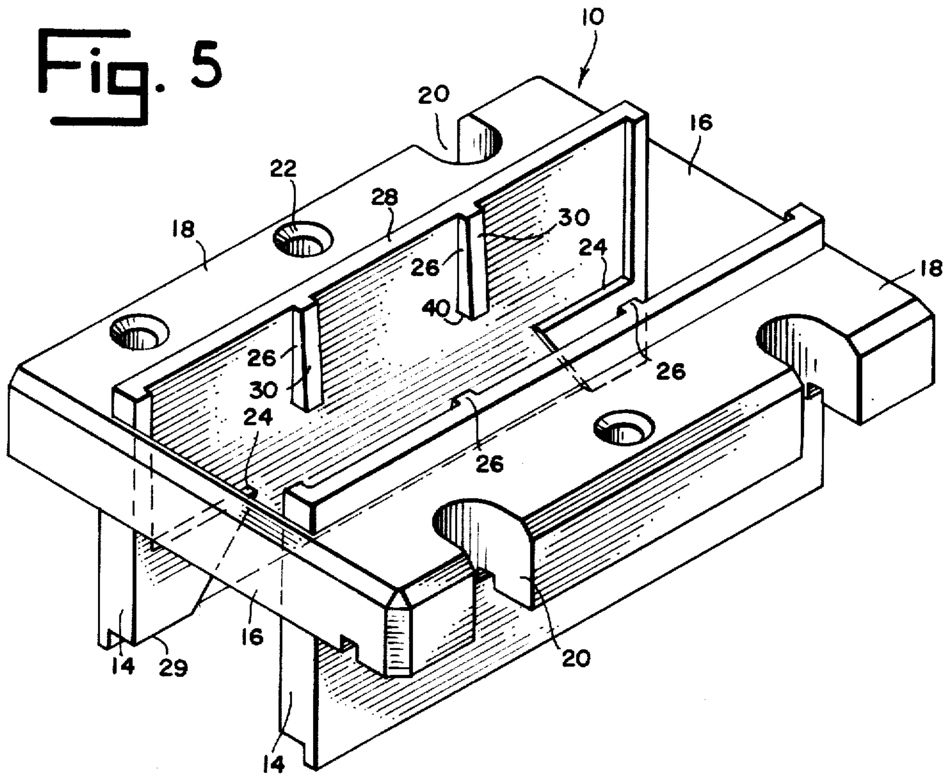
FIG. 5 is a perspective view of the carrier without the circuit package inserted therein.

Illustrated circuit package 12, which is received by carrier 10, includes a body 32 of a generally rectangular shape having a pair of parallel side edges 34. Each side edge 34 of package body 32 carries a plurality of universally directed, parallel leads 36. Leads 36 closely parallel side edges 34 of the carrier body and will vary in number, depending upon the application for the circuit package. It is to be understood that the construction and shape of package 12 can vary depending upon the circuit application. With carrier 10 oriented as illustrated in the drawings, body 32 of package 12 is fitted into the carrier center opening at carrier edge 28 between faces 30 of ribs 26 with its leads 36 projecting upwardly. Ribs 26 are selectively spaced so as to be located between adjacent leads of the package. As the package is pushed downwardly, ribs 26 are contacted by side edges 34 of the package body causing the sides of the carrier to be flexed slightly outwardly until the bottom edges 38 of leads 36 are caused to contact and rest upon shoulders 24 of the carrier and the end edges 40 of the ribs slide or snap over the upper face 42 of the package body 32, as illustrated in FIG. 4, thereby interlocking the circuit package within the carrier with leads 34 of the package lying against and paralleling the inner faces 15 of side walls 14 of the carrier.

The spacing between the planes of shoulders 24 and end edges 40 of ribs 26 is designed to slightly exceed the distance between edges 38 of package leads 36 and upper face 42 of package body 32. Each carrier end wall 16 is of a reduced width as measured between its upper and lower edges so as to be sufficiently flexible to accommodate the camming of the carrier body 32 over ribs 26 and into the interlock position shown in FIGS. 4 and 6. Side walls 14 of the carrier will experience no, or at the most very little, flexure during insertion of the package. It is the flexing of end walls 16 which allows the seating of package 12 within the carrier. It is to be understood that shoulders 24 of carrier 10 may be designed to protrude further outwardly from faces 15 and to be further spaced from end edges 40 of ribs 26 so as to support body 32 of circuit package 12 at its lower face 44 with ribs 26 overlapping upper face 42 of the package body and thus interlocking the package within the carrier.

It is to be understood that the invention is not to be limited to the details above given, but may be modified within the scope of the appended claims.

What we claim is:

1. A carrier for a dual-in-line integrated circuit package, said package having a body defined in part by opposite first and second side faces and interconnecting side edges, said side edges each carrying a plurality of spaced transverse leads having free ends projecting beyond said first side face, said carrier comprising a box-like structure having a vertical opening therethrough defined by two side walls and two end walls extending between upper and lower edges, said side walls having opposed inner faces, each inner face having shoulder means formed thereon located adjacent one of said carrier edges, each inner face of the carrier side walls carrying protrusion means located between the other of said carrier edges and the shoulder means formed on the inner face, each protrusion means forming a part of a rib which extends toward said other carrier edge, each protrusion means for adjacently overlying the second of the side faces of said package body with said carrier being supported upon said shoulder means and the free ends of said leads extending along said inner faces whereby said package is interlockingly retained within said carrier between said shoulder and projection means, each rib including an inner face means tapering toward said other carrier edge to define a camming surface over which said package body slides as said body is pressed into said carrier opening from said other carrier edge, said carrier end walls having sufficient flexibility to accommodate movement of the side walls as the package body is urged into said carrier opening and over said rib face means until said package engages said shoulder means.

2. The carrier of claim 1 wherein each carrier side wall inner face includes two laterally spaced shoulder means.

3. The carrier of claim 2 wherein each side wall inner face carries two laterally spaced protrusion means.

4. The carrier of claim 1 wherein said shoulder means is adapted to support said package at its leads.

5. The carrier of claim 1 wherein said shoulder means is adapted to support said package at the first side face of said package body.

* * * * *